United States Patent [19]

Stadnicar, Jr. et al.

[11] Patent Number: 5,298,330
[45] Date of Patent: Mar. 29, 1994

[54] THICK FILM PASTE COMPOSITIONS FOR USE WITH AN ALUMINUM NITRIDE SUBSTRATE

[75] Inventors: Edward Stadnicar, Jr., Parma, Ohio; Kevin W. Allison, Goleta; Dana L. Hankey, Santa Barbara, both of Calif.; Gordon J. Roberts, Parma, Ohio

[73] Assignee: Ferro Corporation, Cleveland, Ohio

[21] Appl. No.: 50,751

[22] Filed: Apr. 21, 1993

Related U.S. Application Data

[60] Continuation of Ser. No. 620,437, Nov. 30, 1990, abandoned, which is a division of Ser. No. 91,080, Aug. 31, 1987, abandoned.

[51] Int. Cl.$^5$ .............................................. B32B 15/00
[52] U.S. Cl. .................................... 428/432; 428/698; 428/699; 501/97; 501/17
[58] Field of Search .................... 252/512, 513, 514; 501/17, 19, 62; 427/96, 98; 428/698, 699, 432

[56] References Cited

U.S. PATENT DOCUMENTS

| | | | |
|---|---|---|---|
| 4,219,448 | 8/1980 | Ross | 252/500 |
| 4,225,468 | 9/1980 | Donohue et al. | 252/509 |
| 4,251,397 | 2/1981 | Scheiber | 252/511 |
| 4,400,214 | 8/1983 | Ogawa et al. | 106/1.13 |
| 4,476,039 | 10/1984 | Hormadaly | 252/518 |
| 4,501,819 | 2/1985 | Yatsuda et al. | 501/61 |
| 4,540,673 | 9/1985 | Takeda et al. | 501/96 |
| 4,542,105 | 9/1985 | Furukawa et al. | 501/22 |
| 4,574,055 | 3/1986 | Asada et al. | 252/514 |
| 4,657,699 | 4/1987 | Nair | 252/513 |
| 4,657,778 | 4/1987 | Moran | 427/53.1 |
| 4,659,611 | 4/1987 | Iwase et al. | 427/209 |
| 5,047,371 | 9/1991 | Cherukuri | 501/21 |
| 5,071,794 | 12/1991 | Shaikh | 501/17 |
| 5,122,929 | 6/1992 | Palanisamy et al. | 361/400 |

FOREIGN PATENT DOCUMENTS 0132810 2/1985 European Pat. Off. .
0153737 9/1985 European Pat. Off. .
1251766 10/1971 United Kingdom .

OTHER PUBLICATIONS

Taylor et al., "Ceramics Glaze Technology," Pergamon Press, pp. 127, 140-141 and 196.

Primary Examiner—Mark L. Bell
Assistant Examiner—A. Wright
Attorney, Agent, or Firm—Rankin, Hudak & Hill

[57] ABSTRACT

A thick film paste composition adapted to be bonded onto an aluminum nitride substrate is provided which comprises (a) an electrical property regulating component present in an amount sufficient to control the electrical properties of said paste; (b) a lead free or low lead glass composition capable of bonding said electrical property regulating component to the surface of an aluminum nitride substrate.

10 Claims, No Drawings

THICK FILM PASTE COMPOSITIONS FOR USE WITH AN ALUMINUM NITRIDE SUBSTRATE

This is a continuation of U.S. Ser. No. 07/620,437, filed Nov. 30, 1990, now abandoned, which is a divisional of U.S. Ser. No. 07/091,080, filed Aug. 31, 1987, now abandoned.

FIELD OF INVENTION

This invention relates to thick film paste compositions. More particularly, it concerns thick film paste compositions which readily bond or adhere to an aluminum nitride containing substrate.

BACKGROUND OF INVENTION

The use of thick film paste to form resistors, dielectrics and conductors which are employed in hybrid microelectronic components is well known in the electronics art. Broadly, such paste or ink compositions include a conductive, resistive or dielectric component; a bonding material, such as a glass or inorganic oxide; and a vehicle, usually an organic compound or polymer, which serves as a dispersing medium or vehicle for the inorganic components of the paste.

In use, such paste or ink compositions are applied in the desired configuration or pattern onto a suitable substrate. In this regard, substrates have been fabricated from numerous types of materials. For example, such substrate materials include alumina, beryllia, aluminum nitride, and silicon carbide.

Of the many substrate materials utilized today, one which is especially useful is aluminum nitride. However, one problem associated with its use is the limited adhesion of most thick film paste or ink compositions to aluminum nitride or aluminum nitride containing structures.

Accordingly, it is an object of the present invention to provide a means of bonding thick film paste or ink compositions to a ceramic substrate fashioned from aluminum nitride.

SUMMARY OF THE INVENTION

In one aspect, the present invention concerns a thick film paste composition which is adapted to be bonded to an aluminum nitride substrate comprising (a) an electrical property modifier present in an amount sufficient to regulate the electrical properties of said paste; (b) a lead free or low lead glass composition capable of bonding said electrical property modifier to the surface of an aluminum nitride substrate, said glass composition including, in weight percent, from about 27.0 to about 56.5 percent silicon dioxide, from about 0 to about 47.0 percent barium oxide, from about 4.5 to about 25.0 percent boron oxide, from about 0 to about 18.0 percent lead oxide, from about 0 to about 15.0 percent zinc oxide, from about 3.0 to about 14.0 percent aluminum oxide, from about 0 to about 3.0 percent zirconium oxide, from about 0 to about 8.0 percent magnesium oxide, from about 0 to about 12.0 percent calcium oxide, from about 0 to about 3.0 percent fluorine, from about 0 to about 3.0 percent potassium oxide, from about 0 to about 3.0 percent sodium oxide, from about 0 to about 4.0 percent tungsten oxide, and from about 0 to about 4.0 percent lithium oxide, wherein barium oxide plus lead oxide is present in an amount at least equal to about 15.0 percent, zinc oxide plus calcium oxide plus aluminum oxide is present in an amount at least equal to about 5.0 percent, calcium oxide plus magnesium oxide plus barium oxide is present in an amount at least equal to about 7.0 percent, calcium oxide plus magnesium oxide plus zirconium oxide is present in an amount at least equal to about 1.0 percent, zirconium oxide plus calcium oxide plus barium oxide is present in an amount at least equal to about 7.0 percent, and potassium oxide plus sodium oxide plus lead oxide or barium oxide is present in an amount at least equal to 10.0 percent; and (c) an organic dispersion medium for said electrical property modifier component and said glass composition.

The paste of the subject invention may be made into a conductor, dielectric or resistor by properly selecting the electrical property modifier component incorporated into the paste.

In still another aspect, the instant invention is directed to a method of adherently depositing a thick film paste on an aluminum nitride substrate which method comprises (a) providing an aluminum nitride substrate; (b) applying a thick film paste composition to said aluminum nitride substrate, the paste composition including (i) an electrical property modifier component present in an amount sufficient to regulate the electrical properties of the paste; (ii) a lead free or low lead glass composition capable of bonding to and in turn bonding the electrical property modifier component to the surface of said aluminum nitride substrate, said glass composition including, in weight percent, from about 27.0 to about 56.5 percent silicon dioxide, from about 0 to about 47.0 percent barium oxide, from 4.5 to about 25.0 percent boron oxide, from about 0 to about 18.0 percent lead oxide, from about 0 to about 15.0 percent zinc oxide, from about 3.0 to about 14.0 percent aluminum oxide, from about 0 to about 3.0 percent zirconium oxide, from about 0 to about 8.0 percent magnesium oxide, from about 0 to about 12.0 percent calcium oxide, from about 0 to about 3.0 percent fluorine, from about 0 to about 3.0 percent potassium oxide, from about 0 to about 3.0 percent sodium oxide, from about 0 to about 4.0 percent tungsten oxide, and from about 0 to about 4.0 percent lithium oxide, wherein barium oxide plus lead oxide is present in an amount at least equal to about 15.0 percent, zinc oxide plus calcium oxide plus aluminum oxide is present in an amount at least equal to about 5.0 percent, calcium oxide plus magnesium oxide plus barium oxide is present in an amount at least equal to about 7.0 percent, calcium oxide plus magnesium oxide plus zirconium oxide is present in an amount at least equal to about 1.0 percent, zirconium oxide plus calcium oxide plus barium oxide is present in an amount at least equal to about 7.0 percent, and potassium oxide plus sodium oxide plus lead oxide or barium oxide is present in an amount at least equal to 10.0 percent; and (iii) an organic dispersion medium for the electrical property modifier component and the glass composition; and c) heating the so-applied paste composition to a temperature sufficient to cause the paste to become bonded to the aluminum nitride substrate.

DETAILED DESCRIPTION OF THE INVENTION

The present invention concerns a novel thick film paste composition which is adapted for use on an aluminum nitride substrate. Broadly, the paste composition includes (a) an electrical property modifier component, (b) a special lead free or low lead glass (i.e., generally contains 20 percent or less lead) binder which is capable of bonding to an aluminum nitride substrate, and (c) an organic vehicle or dispersing medium for the inorganic constitutents of the paste.

As used herein the term "aluminum nitride substrate" is intended to mean a substrate containing in excess of 40 weight percent aluminum nitride.

One of the important features of the present invention is that by properly selecting the electrical property modifier component, the resultant paste can serve as either a conductor, a resistor or a dielectric. The specific material utilized to render the paste of the invention conductive, dielectric, or resistive is not critical per se. All that is required is that it produce the desired electrical properties in the final product. If the paste is to be electrically conductive, it is common to use a suitably conductive metal as the electrical modifier component; if the paste is to be resistive, ruthenium dioxide is generally employed; if the paste is to function as a dielectric, the composition can be used alone or a refractory oxide filler can be utilized. Since the use of these electrical property modifier materials is well known in the art, they will not be discussed hereinafter in detail.

The glass binders used in connection with the present invention is critical in that it must bond to aluminum nitride. Glasses which have been found to be exceptionally useful for this purpose include those containing the listed components within the ranges specified in Table 1.

TABLE 1

| Component | Compositional Range (in weight %) |
|---|---|
| $SiO_2$ | 27.0–56.5 |
| BaO | 0–47.0 |
| $B_2O_3$ | 4.5–25.0 |
| PbO | 0–18.0 |
| ZnO | 0–15.0 |
| $Al_2O_3$ | 3.0–14.0 |
| $ZrO_2$ | 0–3.0 |
| MgO | 0–8.0 |
| CaO | 0–12.0 |
| $F_2$ | 0–3.0 |
| $K_2$ | 0–3.0 |
| $Na_2O$ | 0–3.0 |
| $WO_3$ | 0–4.0 |
| $LiO_2$ | 0–4.0 |

Wherein:
(1) barium oxide plus lead oxide is present in an amount at least equal to about 15.0 percent,
(2) zinc oxide plus calcium oxide plus aluminum oxide is present in an amount at least equal to about 5.0 percent,
(3) calcium oxide plus magnesium oxide plus barium oxide is present in an amount at least equal to about 7.0 percent,
(4) calcium oxide plus magnesium oxide plus zirconium oxide is present in an amount at least equal to about 1.0 percent,
(5) zirconium oxide plus calcium oxide plus barium oxide is present in an amount at least equal to about 7.0 percent, and
(6) potassium oxide plus sodium oxide plus lead oxide or barium oxide is present in an amount at least equal to 10.0 percent.

Special glasses having a composition within the above ranges which are suitable for the practice of the present invention are set forth in Table 2 below.

TABLE 2

| Component | Compositional Range (in weight %) | | |
|---|---|---|---|
|  | Glass A | Glass B | Glass C |
| $SiO_2$ | 37–56.5 | 38–45 | 28–45 |
| BaO | 0–24 | 10–24 | 20–40 |
| $B_2O_3$ | 4–14 | 7–14 | 7–20 |
| PbO | 0–18 | 0–17 | — |
| ZnO | 0–12.2 | 5–12.2 | — |
| $Al_2O_3$ | 3–10 | 3–8 | 2–14 |
| $ZrO_2$ | 0–3 | 0–3 | 0–3 |
| MgO | 0–6 | 0–6 | 0–8 |
| CaO | 0–8 | 0–7 | — |
| $F_2$ | 0–3 | 0–3 | — |
| $K_2O$ | 0–3 | — | — |
| $Na_2O$ | 0–3 | — | — |
| $WO_3$ | — | — | 0–4 |
| $LiO_2$ | 0–3 | 0–3 | — |

Wherein:
(1) barium oxide plus lead oxide is present in an amount at least equal to about 15.0 percent,
(2) zinc oxide plus calcium oxide plus aluminum oxide is present in an amount at least equal to about 5.0 percent,
(3) calcium oxide plus magnesium oxide plus barium oxide is present in an amount at least equal to about 7.0 percent,
(4) calcium oxide plus magnesium oxide plus zirconium oxide is present in an amount at least equal to about 1.0 percent,
(5) zirconium oxide plus calcium oxide plus barium oxide is present in an amount at least equal to about 7.0 percent, and
(6) potassium oxide plus sodium oxide plus lead oxide or barium oxide is present in an amount at least equal to 10.0 percent.

Additional special glasses which are also suitable for the practice of the instant invention include those set forth in Table 3.

TABLE 3

| Component | Compositional Range (in weight %) | | | |
|---|---|---|---|---|
|  | Glass D | Glass E | Glass F | Glass G |
| $SiO_2$ | 36–43 | 40–48 | 28–38 | 50–56.5 |
| BaO | 20–25 | 8–16 | 35–40 | 0–5 |
| $B_2O_3$ | 10–16 | 6–11 | 7–20 | 3–8 |
| PbO | — | 8–18 | — | 10–18 |
| ZnO | 9–14 | 0–5 | — | — |
| $Al_2O_3$ | 3–8 | 3–7 | 8–14 | 7–11 |
| $ZrO_2$ | 0–3 | 0–3 | 0–2 | — |
| MgO | 0–6 | 0–6 | — | — |
| CaO | — | 2–8 | — | 7–12 |
| $F_2$ | — | 0–3 | — | — |
| $K_2O$ | — | — | — | 0–3 |
| $Na_2O$ | — | — | — | — |
| $WO_3$ | — | — | 0–4 | — |
| $LiO_2$ | — | 0–3 | — | — |
|  | (a) | (b) | (c) | (d) |

(a) In Glass D, zirconium oxide plus magnesium oxide is present in an amount of at least about 1.0 percent.
(b) In Glass E, zinc oxide plus calcium oxide is present in an amount of at least 5.0 percent, magnesium oxide plus calcium oxide is present in an amount of at least 5.0 percent, zinc oxide plus calcium oxide is present in an amount of at least 3.0 percent, fluorine plus lead oxide is present in an amount of at least 9.0 percent, lithium oxide plus lead oxide is present in an amount of at least 10.0 percent.

(c) In Glass F, zirconium oxide plus tungsten oxide is present in an amount of at least 1.0 percent.
(d) In Glass G, barium oxide plus calcium oxide is present in an amount of at least 9.0 percent, potassium oxide plus calcium oxide is present in an amount of about at least 8.0 percent.

Any inert liquid can be used as the dispensing medium in the practice of the present invention. Water or any one of various organic liquids, with or without thickening and/or stabilizing agents and/or other common additives can be used as the dispersing medium. Exemplary of the organic liquids which can be used are the aliphatic alcohols; esters of such alcohols, for example, the acetates and propionates; terpenes such as pine oil, terpineol and the like; solutions of resins such as the polymethacrylates of lower alcohols, or solutions of ethyl cellulose, in solvents such as pine oil, the monobutyl ether of ethylene glycol monoacetate, and Carbitol. The dispersing medium can contain or be composed of volatile liquids to promote fast setting after application to the substrate.

The instant invention will now be described in further detail with reference to the following examples of the preferred practice of the invention.

Example I
(Conductor Formulation)

| Component | Weight % |
|---|---|
| Electrical Property Modifier - Au | 82.6 |
| Glass Binder* | 2.6 |
| $Li_2CO_3$ | 1.8 |
| Organic Medium | 13.0 |

*Glass Binder Composition

| Component | Weight Percent |
|---|---|
| $SiO_2$ | 28.4 |
| $B_2O_3$ | 19.2 |
| BaO | 39.2 |
| $Al_2O_3$ | 8.6 |
| $ZrO_2$ | 1.6 |
| $WO_3$ | 3.0 |

The glass binder composition was prepared in a conventional manner by mixing materials containing or producing the listed ingredients in an amount sufficient to yield a mixture having the specified composition. This mixture was then placed in a platinum crucible and heated to about 1500° C. for about 1.5 hours. While molten, the glass composition was then poured on cold steel rolls to form thin flakes suitable for milling. These flakes were then milled to a suitable particle size (0.5 to 20 microns). The resultant glass particles were then mixed with the electrical property modifier (gold having a particle size of about 0.5 to 15 microns) by rolling them on a 3 roll mill or shaking them on a paint mixer with the resultant mixture then being dispersed into an organic printing vehicle. The organic vehicle is usually ethyl cellulose dissolved in a suitable solvent such as terpineol or butyl carbitol. If desired, known additives can be employed to regulate the rheological properties of the finished composition. The powders are dispersed into and wetted by the vehicle system by vibrating on a paint shaker. The resultant mix is then passed through a 3 roll paint mill to break up any agglomerated powder and homogenize the composition. If desired, several passes at increasing pressure can be utilized.

The so-prepared thick film composition is then applied to the aluminum nitride substrate by a modified conventional silk screen printing process in which the composition is forced through a fine mesh stainless steel screen in a desired pattern. (Typically the size of the screen varies from about 200 to 325 mesh.) The composition is then dried at approximately 100° C. for about 10 minutes to drive off the residual solvent. The dried patterns are then fired at a peak temperature of about 850° C. for about 10 minutes. The total heating time is typically about 25 to 60 minutes.

When tested, it was observed that the conductive paste layer was adherently bonded to the substrate. It had a resistance of 3.3 m Ohms/sq./mil thickness, an adhesion of 2400 psi (using a standard expoxied-aluminum stud pull test), and was wire bondable.

Example II
(Dielectric Formulation)

| Component | Weight % |
|---|---|
| Glass Binder* | 47.6 |
| Electrical Property Modifier | |
| (A) $Al_2O_3$ | 13.6 |
| (B) Cordierite | 6.8 |
| Organic Vehicle | 32.0 |

*Glass Binder Composition

| Component | Weight Percent |
|---|---|
| $SiO_2$ | 38.9 |
| BaO | 23.9 |
| $B_2O_3$ | 13.4 |
| ZnO | 12.0 |
| $Al_2O_3$ | 5.0 |
| $ZrO_2$ | 1.5 |
| MgO | 5.3 |

A dielectric thick film paste consisting of the foregoing ingredients was prepared and applied to an aluminum nitride substrate in the same manner as described in Example I.

Upon testing, it was observed that the paste was adherently bonded to the substrate. The dielectric properties of the paste were as follows:

| | |
|---|---|
| Insulation Resistance | $1.5-7.0 \times 10^{12}$ ohms |
| Dielectric Constant | 7.0–7.5 |
| Adhesion | 7000–8000 psi |
| Breakdown Voltage | greater than 400 Volts per mil |

Example III
(Resistor Formulation)

| Component | Weight % |
|---|---|
| Noble Metal Containing Conductive Phase | 37.7 |
| Glass Binder* | 30.4 |
| Refractory Filler Oxides | 7.4 |
| Organic Vehicle | 24.5 |

The Glass Binder* utilized was the same as that employed in Example I.

A resistor thick film paste consisting of the foregoing ingredients was prepared and applied to an aluminum nitride substrate in the same manner as described in Example I.

Upon testing it was observed that the paste was adherently bonded to the substrate. The resistor properties of the paste were as follows:

| | |
|---|---|
| Sheet Resistivity (Ps) | 10 Ohms/Square |
| Temperature Coefficient of Resistance | 100 ppm/°C. |
| Electrostatic Discharge Sensitivity (% ΔR-2000V) | less than 2% |

| | | | |
|---|---|---|---|
| Short Term Overload Voltage (% R-3.3V) | | | less than 1% |

As above noted, various materials, including minerals and refractory oxides, can be added to the thick paste composition of the instant invention to render the paste dielectric. As these materials are well known in the art, they will not be discussed herein in detail.

Typical organic dispersion mediums used in the practice of the present invention include 5-15% of ethyl cellulose, 0-5% of a thixotropic agent, and 80-95% of an organic solvent such as terpineol or butyl Carbitol. However, as these materials do not form a part of the instant invention, they will not be discussed herein in detail.

Based on test data, good results are obtained when the thick film or ink composition of the instant invention comprises, in weight percent, the ingredients listed in Table 4 below.

TABLE 4

| Component | Conductor | Dielectric | Resistor |
|---|---|---|---|
| Electrical Property Modifier (EPM) | 75-99 | 0-40 | 2-90 |
| Glass | trace-25 | 60-100 | 10-98 |
| Ratio of Organic Dispersant to EPM + Glass | 1:2 to 1:10 | 1:1.5 to 1:10 | 1:1.5 to 1:10 |

The glasses disclosed herein are novel in their ability to bond to aluminum nitride. Additionally, they are characterized by their chemical compatability, good wetting properties and thermal coefficient of expansion.

While there have been described herein what are at present considered to be the preferred embodiments of this invention, it will be apparent to those skilled in the art that various changes and modifications may be made therein without departing from the invention, and it is therefore, intended in the appended claims to cover all such changes and modifications as fall within the true spirit and scope of the invention.

We claim:

1. An aluminum nitride substrate having bonded to at least a portion of one surface thereof a thick film composition, said thick film comprising a glass composition and an electrical property modifier, the addition of said electrical property modifier rendering said thick film composition a resistor, a conductor or a dielectric, said glass composition comprising:

in weight percent, from about 27.0 to about 56.5 percent silicon dioxide, from about 20 to about 47.0 percent barium oxide, from about 4.5 to about 25.0 percent boron oxide, from about 0 to about 18.0 percent lead oxide, from about 0 to about 15.0 percent zinc oxide, from about 3.0 to about 14.0 percent aluminum oxide, at least a trace amount of zirconium oxide, said zirconium oxide being present up to about 3.0 percent, from about 0 to about 8.0 percent magnesium oxide, from about 0 to about 12.0 percent calcium oxide, from about 0 to about 3.0 percent fluorine, from about 0 to about 3.0 percent potassium oxide, from about 0 to about 3.0 percent sodium oxide, from about 0 to about 4.0 percent tungsten oxide, and from about 0 to about 4.0 percent lithium oxide, wherein barium oxide plus lead oxide is present in an amount at least equal to about 15.0 percent, zinc oxide plus calcium oxide plus aluminum oxide is present in an amount at least equal to about 5.0 percent, calcium oxide plus magnesium oxide plus barium oxide is present in an amount at least equal to about 7.0 percent, calcium oxide plus magnesium oxide plus zirconium oxide is present in an amount at least equal to about 1.0 percent, zirconium oxide plus calcium oxide plus barium oxide is present in an amount at least equal to about 7.0 percent, potassium oxide plus sodium oxide plus lead oxide or barium oxide is present in an amount at least equal to 10.0 percent.

2. The aluminum nitride substrate of claim 1 wherein said glass composition includes:

| Component | Compositional Range (in weight percent) |
|---|---|
| $SiO_2$ | 37-56.5 |
| [BaO] | [0-24] |
| $B_2O_3$ | 4-14 |
| PbO | 0-18 |
| ZnO | 0-12.2 |
| $Al_2O_3$ | 3-10 |
| [$ZrO_2$] | [0-3] |
| MgO | 0-6 |
| CaO | 0-8 |
| $F_2$ | 0-3 |
| $K_2O$ | 0-3 |
| $Na_2O$ | 0-3 |
| $Li_2O$. | 0-3. |

3. The aluminum nitride substrate of claim 1 wherein said glass composition includes:

| Component | Compositional Range (in weight percent) |
|---|---|
| $SiO_2$ | 38-45 |
| [BaO] | [10-24] |
| $B_2O_3$ | 7-14 |
| PbO | 0-17 |
| ZnO | 5-12.2 |
| $Al_2O_3$ | 3-8 |
| [$ZrO_2$] | [0-3] |
| MgO | 0-6 |
| CaO | 0-7 |
| $F_2$ | 0-3 |
| $Li_2O$. | 0-3. |

4. The aluminum nitride substrate of claim 1 wherein said glass composition includes:

| Component | Compositional Range (in weight percent) |
|---|---|
| $SiO_2$ | 28-45 |
| [BaO] | [20-40] |
| $B_2O_3$ | 7-20 |
| $Al_2O_3$ | 2-14 |
| [$ZrO_2$] | [0-3] |
| MgO | 0-8 |
| $WO_3$ | 0-4. |

5. The aluminum nitride substrate of claim 1 wherein said electrical property modifier is a material which renders said thick film composition electrically conductive.

6. The aluminum nitride substrate of claim 1 wherein said glass composition includes:

| Component | Compositional Range (in weight percent) |
|---|---|
| SiO$_2$ | 28.4 |
| B$_2$O$_3$ | 19.2 |
| BaO | 39.2 |
| Al$_2$O$_3$ | 8.6 |
| ZrO$_2$ | 1.6 |
| WO$_3$ | 3.0. |

7. The aluminum nitride substrate of claim 1 wherein said electrical property modifier component is a material which renders said composition a dielectric.

8. The aluminum nitride substrate of claim 8 wherein said glass composition includes:

| Component | Compositional Range (in weight percent) |
|---|---|
| SiO$_2$ | 38.9 |
| BaO | 23.9 |

| Component | Compositional Range (in weight percent) |
|---|---|
| B$_2$O$_3$ | 13.4 |
| ZnO | 12.0 |
| Al$_2$O$_3$ | 5.0 |
| ZrO$_2$ | 1.5 |
| MgO | 5.3. |

9. The aluminum nitride substrate of claim 1 wherein said electrical property modifier is a material which renders said thick film composition a resistor.

10. The aluminum nitride substrate of claim 9 wherein said glass composition includes:

| Component | Compositional Range (in weight percent) |
|---|---|
| SiO$_2$ | 28.4 |
| B$_2$O$_3$ | 19.2 |
| BaO | 39.2 |
| Al$_2$O$_3$ | 8.6 |
| ZrO$_2$ | 1.6 |
| WO$_3$ | 3.0. |

* * * * *